US 7,733,502 B2
Jun. 8, 2010

(12) United States Patent
Moriya et al.

(10) Patent No.: US 7,733,502 B2
(45) Date of Patent: Jun. 8, 2010

(54) ROUGHNESS EVALUATION METHOD AND SYSTEM

(75) Inventors: Tsuyoshi Moriya, Nirasaki-shi (JP); Machi Moriya, Nirasaki-shi (JP)

(73) Assignee: Tokyo Electron Limited, Tokyo (JP)

( * ) Notice: Subject to any disclaimer, the term of this patent is extended or adjusted under 35 U.S.C. 154(b) by 192 days.

(21) Appl. No.: 11/971,404

(22) Filed: Jan. 9, 2008

(65) Prior Publication Data
US 2008/0165367 A1 Jul. 10, 2008

Related U.S. Application Data

(60) Provisional application No. 60/911,344, filed on Apr. 12, 2007.

(30) Foreign Application Priority Data
Jan. 10, 2007 (JP) ............................. 2007-002101

(51) Int. Cl.
G01B 11/30 (2006.01)
(52) U.S. Cl. ...................... 356/600; 356/445
(58) Field of Classification Search ................. 356/600, 356/445–448, 625–636
See application file for complete search history.

(56) References Cited

U.S. PATENT DOCUMENTS

| | | | |
|---|---|---|---|
| 2004/0260420 A1 | 12/2004 | Ohno et al. | |
| 2005/0195413 A1* | 9/2005 | Brill | 356/636 |
| 2006/0072807 A1* | 4/2006 | Bultman et al. | 382/149 |

* cited by examiner

Primary Examiner—Hoa Q Pham
(74) Attorney, Agent, or Firm—Oblon, Spivak, McClelland, Maier & Neustadt, L.L.P.

(57) ABSTRACT

A roughness evaluation method for evaluating a roughness of lines formed on a substrate includes a measuring step of irradiating light onto a plurality of locations of the substrate and measuring a state of reflected light by a scatterometry; and an analyzing step of evaluating the roughness of the lines based on a variation in value measured in the measuring step. A roughness evaluation system includes an optical device for irradiating light onto the substrate and measuring a state of reflected light by a scatterometry; a moving device for moving the substrate in at least one of an x-direction and a y-directions on a horizontal plane; a controller for controlling the moving device such that the optical device measures a plurality of locations on the substrate; and an analysis unit for evaluating the roughness based on a variation in measured values at the plurality of locations on the substrate.

11 Claims, 11 Drawing Sheets

MEASURING PLURAL TIMES
FOR A LONG TIME PERIOD

WAVELENGTH (nm)

EXTRACTING STANDARD NOISE COMPONENT

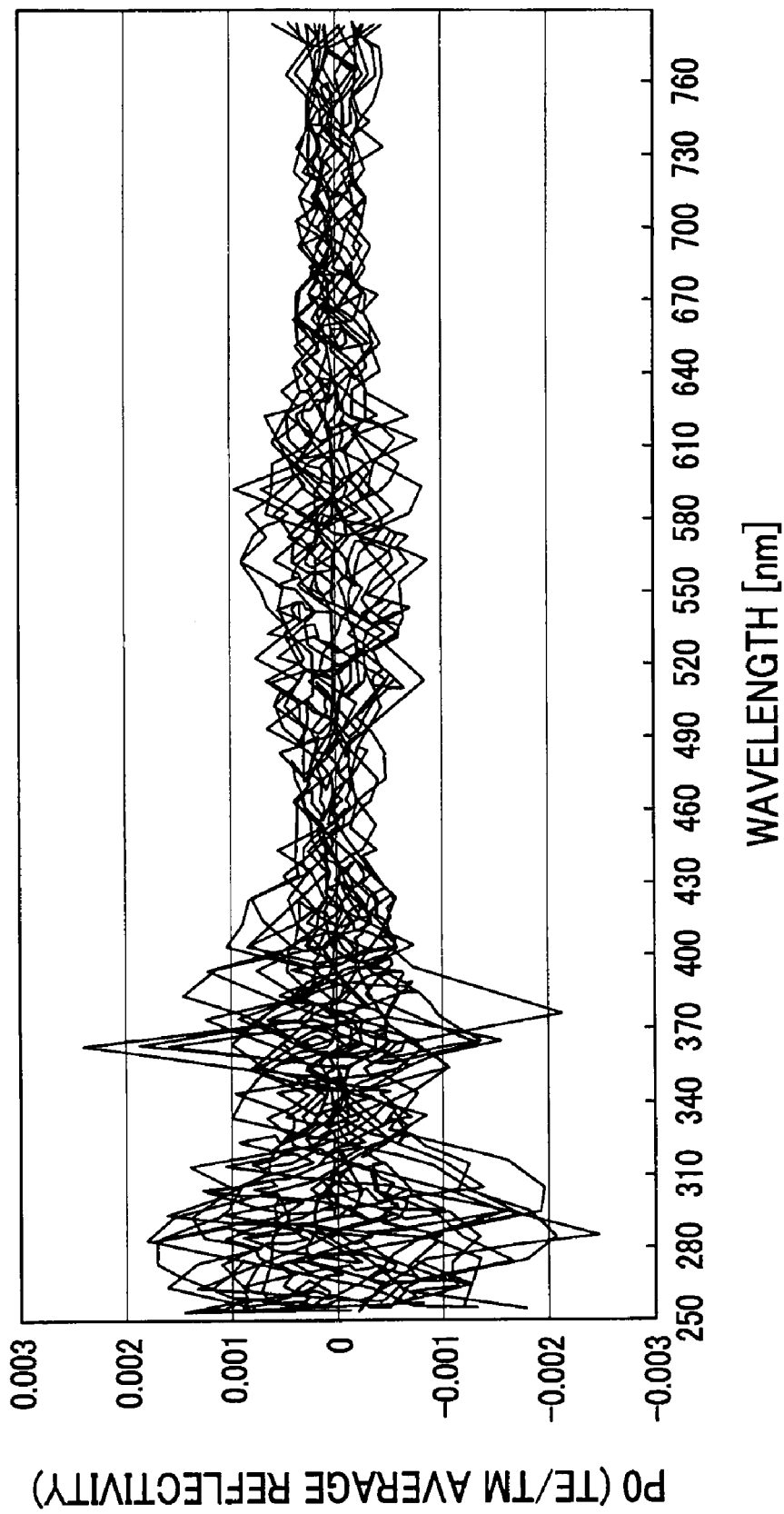

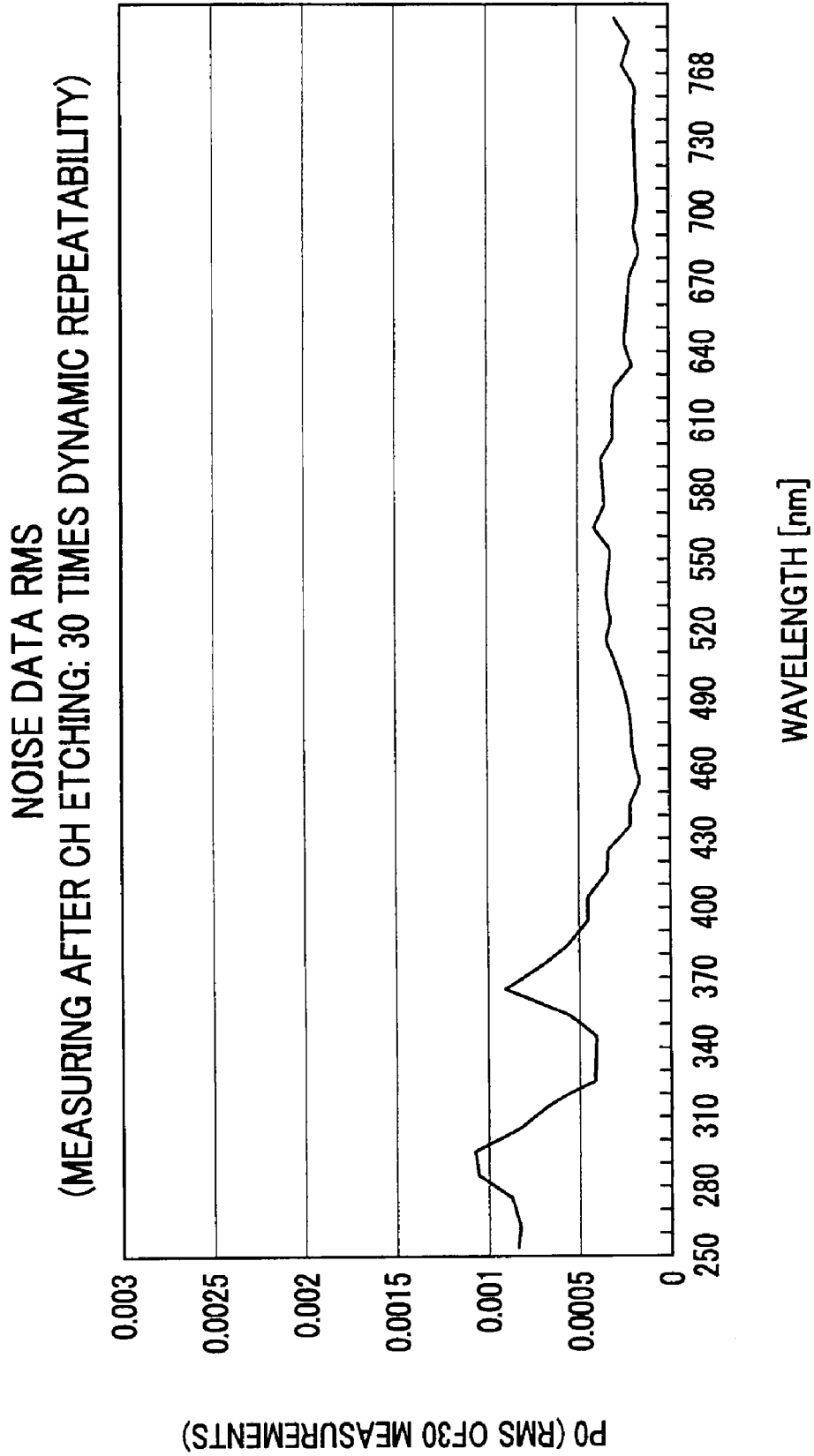

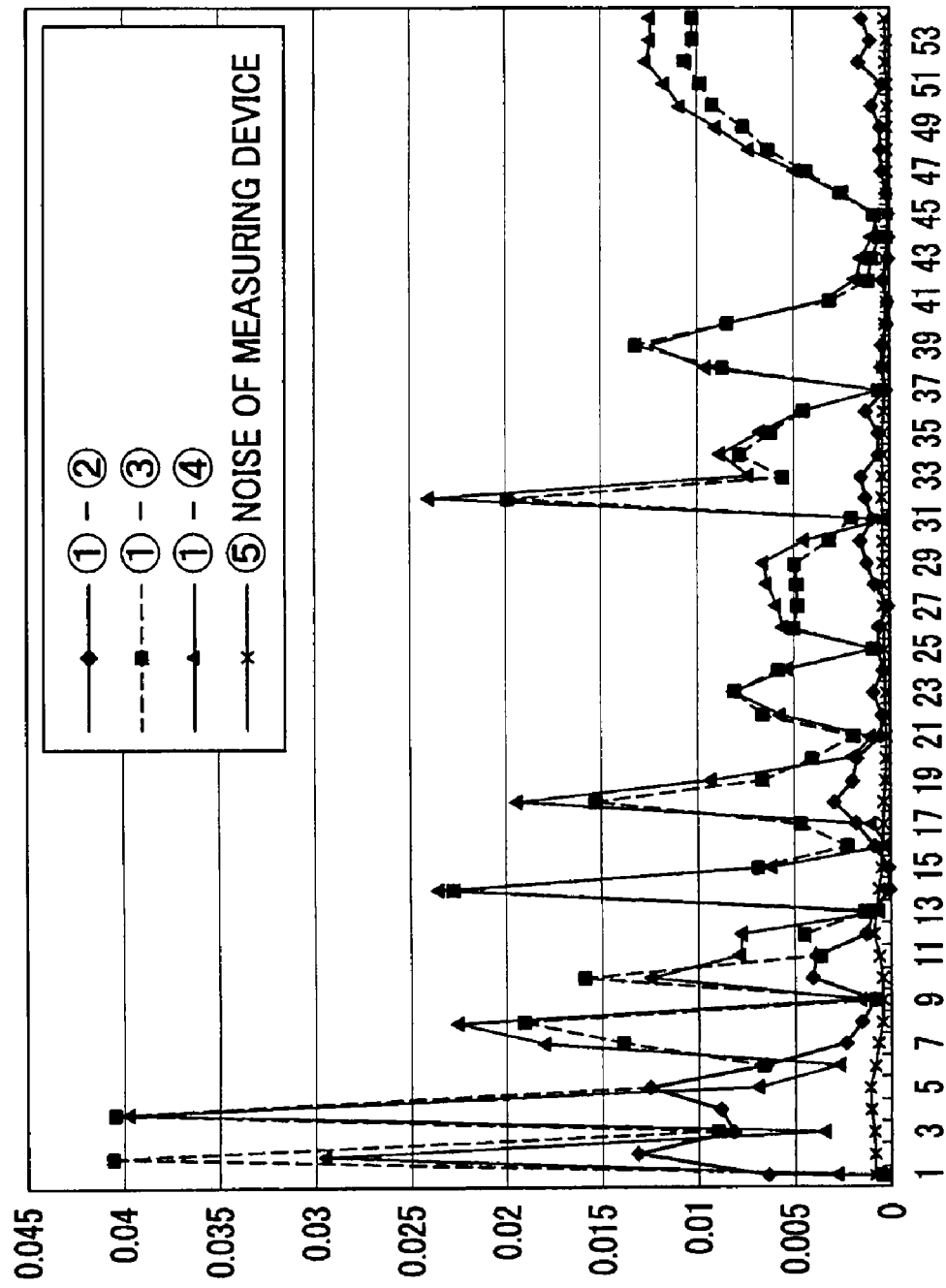

(LER EXAMPLE)

(LWR EXAMPLE)

ROUGHNESS EVALUATION METHOD AND SYSTEM

FIELD OF THE INVENTION

The present invention relates to a method and system for evaluating a roughness of a line formed on a substrate; and, more particularly, to a lithography method and system for evaluating a roughness of a resist formed in a lithography process.

BACKGROUND OF THE INVENTION

In a lithography process for manufacturing a semiconductor, a line edge roughness (hereinafter, referred to as "LER") and a line width roughness (hereinafter, referred to as "LWR") occur in a pattern formed on a wafer, especially in line-and-space patterns in which a plurality of line patterns are arranged at a specified interval, due to the effect of standing waves of light. The LER refers to the size of irregularities on a sidewall La of a line L, as shown in a cross sectional view of a wafer in FIG. 13. The LWR refers to the size of irregularities on both widthwise end portions, as shown in a plan view of a wafer in FIG. 14.

The standing waves of light contribute to the roughness. Light passing through a mask in an exposure process or light radiated to a resist is refracted or reflected, whereby light is interfered. If the interference light becomes strong or weak, ripple-shaped light patterns occur in the lines of the resist. In case of the transistors for nanoelectronics such as the 32 nm or 45 nm technology generation, the width of lines is 40 nm or 60 nm, which is much smaller than the wavelength of the exposure light. Therefore, roughness easily occurs by standing waves of light in the transistors for nanoelectronics.

It is important to control the LER and LWR in the lithography. Since the size of the line-and-space patterns is proportional to the gate length, the LER and LWR indicate the dimension variation in the gate pattern. Therefore, the irregular gate pattern has an influence on transistor performance. For example, roughness in the 45 nm technology generation should be suppressed to about 3 nm or less. However, roughness of 3 nm to 6 nm occurs in practice. Therefore, the lithography should be provided with the feedback or feedforward of the result obtained by measuring the LER and the LWR. Roughness occurs in a circuit pattern after the etching process as well as in the resist pattern.

Currently, SEM (Scanning Electron Microscopy) observation has been used to measure the LER and the LWR. According to the SEM observation, secondary electrons emitted from a substrate upon irradiation of an electron beam form an image. The SEM is classified into a CD (Critical Dimension) SEM displaying an image of a pattern which is taken from above the wafer (see FIG. 14) and a cross-section SEM displaying a cross-sectional image of a pattern (see FIG. 13). The LWR is measured by the CD-SEM, while the LER is measured by the cross-section SEM. If the LER and LWR are measured by the SEM, roughness can be quantitatively determined by an image analysis.

On the other hand, a scatterometry method as another technique for measuring a pattern shape of a wafer is disclosed in, e.g., Patent Document 1. The scatterometry method uses an ellipsometer or reflectance spectrometer, by which light is irradiated on the wafer and a polarization state of the reflected light or a reflectivity of the wafer is measured. The polarization state and reflectivity of each wavelength region vary according to the pattern shape. Therefore, the pattern shape can be specified from the measured polarization state or reflectivity of each wavelength region by referring to the simulation results.

(Patent Document 1) Japanese Patent Application Publication No. 2005-33187 (Paragraphs [0067] to [0080])

However, since the SEM can measure only several square microns at a time, the measurement takes a long time. Further, the wafer is damaged by irradiation of the electron beam. Therefore, it is not suitable for measurement of practical devices.

Furthermore, in order to measure the LER using the cross-section SEM, the wafer has to be cut before the measurement. Thus cut wafer cannot be used as a chip, thereby deteriorating the production yield. Although the LER is related to the LWR, it is assumed that the causes are different. That is, even though the LWR has been measured, the LER cannot be estimated from the LWR.

The method for measuring roughness by using the SEM has the aforementioned drawbacks. The present inventor has attempted to use the scatterometry method for the measurement of roughness. However, although the pattern shape may be measured by using the present scatterometry method, it is difficult to measure roughness of the pattern according to the prior art. That is, since the pattern shape is measured only once at a specified location of the wafer and roughness is not much larger than the pattern shape, it is difficult to ascertain whether the variation in the obtained spectrum is due to roughness or it is due to the pattern shape.

SUMMARY OF THE INVENTION

In view of the above, the present invention provides a method and system for evaluating roughness which are suitable for measuring roughness of a pattern on a wafer.

In accordance with a first aspect of the present invention, there is provided a roughness evaluation method for evaluating a roughness of one or more lines formed on a substrate, including a measuring step of irradiating light onto a plurality of locations of the substrate and measuring a state of reflected light by a scatterometry; and an analyzing step of evaluating the roughness of the lines based on a variation in value measured in the measuring step.

It is also possible that, in the measuring step, the state of the light reflected by the substrate is measured by scanning the lines in a linear direction.

It is also possible that, in the measuring step, polarized light is irradiated onto the substrate and a polarization state of reflected light is measured by an ellipsometry, or light is irradiated onto the substrate and a reflectivity, which is a ratio of an intensity of the light irradiated on the substrate to an intensity of the light reflected therefrom, is measured by a reflectometry.

The roughness evaluation method may further include a sample measuring step of irradiating light onto a plurality of locations of a reference sample to measure a state of reflected light in advance by a scatterometry method, wherein, in the analyzing step, the variation in the value measured in the measuring step is compared to a variation in value of the reference sample measured in the sample measuring step to calculate an index based on a difference between the variation in the value measured in the measuring step and the variation in the value of the reference sample measured in the sample measuring step, and wherein, if the index is larger than a specific value, it is evaluated that there is a roughness.

It is also possible that the lines are formed by a resist using lithography.

It is also possible that the roughness is a LER which is a size of irregularities on sidewalls of the line.

It is also possible that the lines have line-and-space patterns in which a plurality of line patterns are arranged at a specified interval.

In accordance with a second aspect of the present invention, there is provided a lithography method including a resist pattern forming step of coating a resist film on a substrate, exposing it through a mask and developing it; an etching step of removing a part of the substrate that is not covered with the resist film by etching; a roughness evaluating step of evaluating a roughness of the resist after the resist pattern forming step or evaluating roughness of a circuit pattern after the etching step; and a processing condition changing step of changing processing conditions of the resist pattern forming step or the etching step based on the roughness evaluated in the roughness evaluating step, wherein the roughness evaluating step includes a measuring step of irradiating light onto a plurality of locations of the substrate and measuring a state of reflected light by a scatterometry; and an analyzing step of evaluating a roughness of one or more lines based on a variation in value measured in the measuring step.

In accordance with a third aspect of the present invention, there is provided a roughness evaluation system for evaluating a roughness of one or more lines formed on a substrate, the system including: an optical device for irradiating light onto the substrate and measuring a state of reflected light by a scatterometry; a moving device for moving the substrate in at least one of an x-direction and a y-directions on a horizontal plane; a controller for controlling the moving device such that the optical device measures a plurality of locations on the substrate; and an analysis unit for evaluating the roughness based on a variation in measured values at the plurality of locations on the substrate.

It is also possible that the controller controls the moving device such that the optical device scans in the linear direction of the lines to measure the state of the light reflected by the substrate.

It is also possible that the optical device is an ellipsometer or a reflectance spectrometer.

In accordance with a fourth aspect of the present invention, there is provided a lithography system including a resist pattern forming system for coating a resist film on a substrate, exposing it through a mask and developing it; an etching system for removing a part of the substrate that is not covered with the resist film by etching; and a roughness evaluation system for evaluating a roughness of a resist on the substrate or a circuit pattern on the substrate, wherein processing conditions of the resist pattern forming system or the etching system are changed based on the roughness evaluated by the roughness evaluation system, and wherein the roughness evaluation system includes: an optical device for irradiating light onto the substrate and measuring a state of reflected light by a scatterometry; a moving device for moving the substrate in at least one of an x-direction and a y-directions on a horizontal plane; a controller for controlling the moving device such that the optical device measures a plurality of locations on the substrate; and an analysis unit for evaluating the roughness based on a variation in measured value at the plurality of locations on the substrate.

In accordance with the present invention, the plurality of locations on the substrate are measured by the scatterometry method. If roughness in the linear direction of the lines is small, the variation in the measured value is also small. In contrast, if roughness in the linear direction of the lines is large, the measured value varies more. Roughness can be evaluated by extracting the variation in the measured value.

BRIEF DESCRIPTION OF THE DRAWINGS

The above features of the present invention will become apparent from the following description of embodiments given in conjunction with the accompanying drawings, in which:

FIG. 9 shows a relationship between the wavelength and the noise data;

FIG. 10 shows a relationship between the wavelength and the mean square of the difference of the noise data;

FIG. 11 is a graph showing the absolute value of the difference between the reference noise of sample 1 and each noise of samples 2 to 4 for each wavelength;

DETAILED DESCRIPTION OF THE EMBODIMENTS

Hereinafter, a roughness evaluation system and lithography system in accordance with embodiments of the present invention will be described with reference to the accompanying drawings, which form a part hereof.

Figure 1:
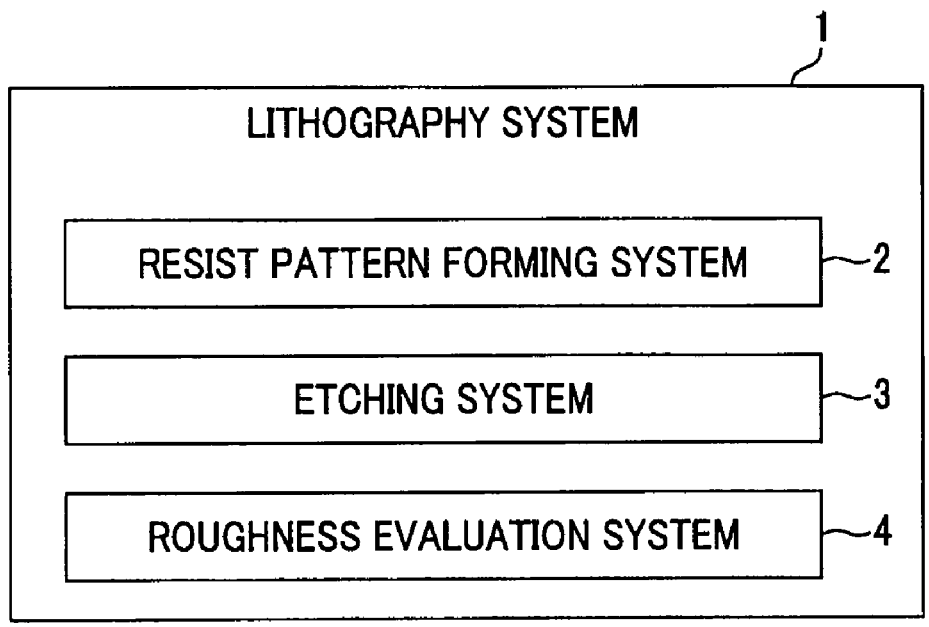
FIG. 1 shows a configuration view of a lithography system in accordance with an embodiment of the present invention.

FIG. 1 shows a configuration view of the lithography system. The lithography system 1 includes a resist pattern forming system 2, an etching system 3 and a roughness evaluation system 4.

The resist pattern forming system 2 includes an oxidation device, a resist coater, an exposure device and a developing apparatus. A substrate, e.g., a wafer is coated with a resist film, exposed through a mask, and developed. The etching system 3, which includes a vacuum processing apparatus and a liquid processing apparatus, removes a part of the wafer that is not covered with the resist film by etching. The roughness evaluation system 4 evaluates roughness of the resist on the wafer or roughness of the circuit pattern on the wafer.

Figure 2:
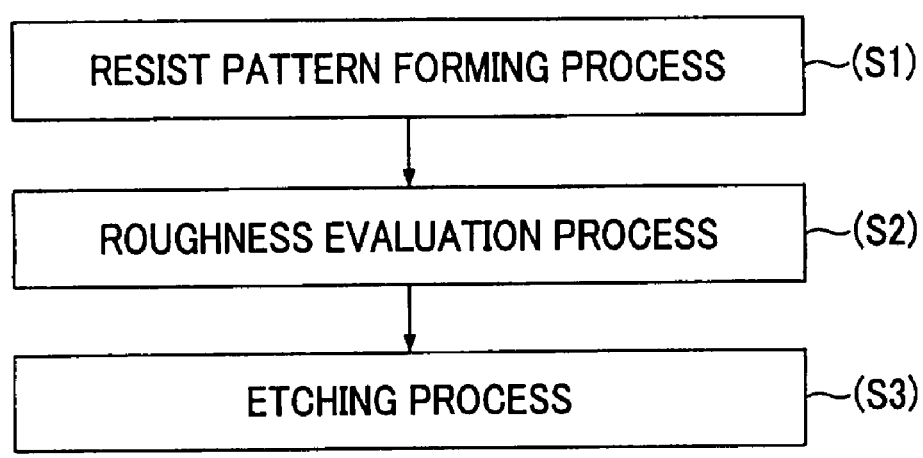
FIG. 2 is a flow chart for showing the processing operation of the lithography system in accordance with the embodiment.
Figure 3A:
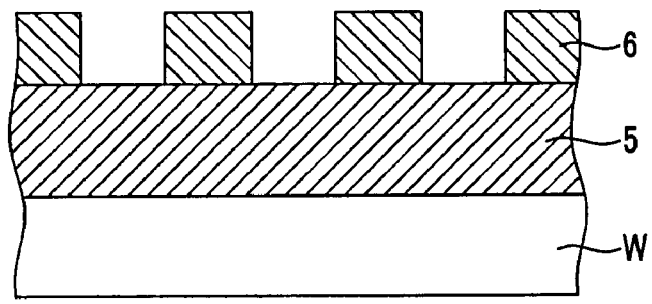
FIGS. 3A to 3C illustrate cross sectional views of a structure of a wafer in each operation process of the lithography system in accordance with the embodiment.
Figure 3B:
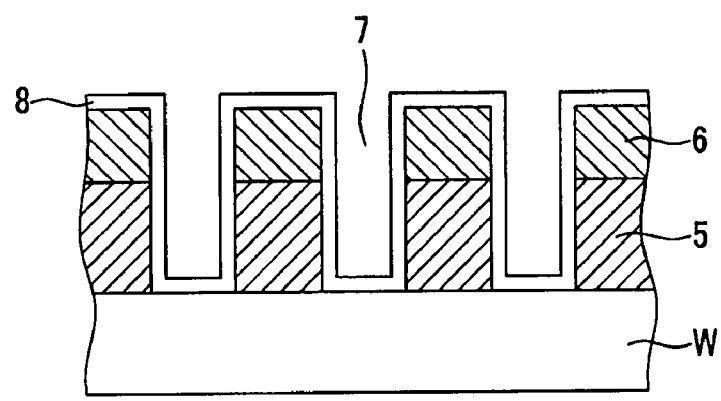
Figure 3C:
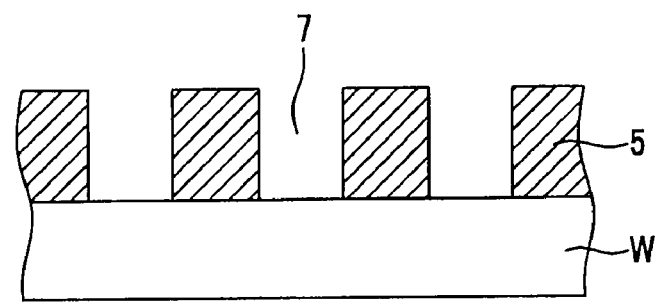

A process of forming a plurality of line-and-spaces on a wafer W will be described as an example of the processing operation of the lithography system with reference to a flow chart of FIG. 2 and cross sectional views of a wafer W of each process shown in FIGS. 3A to 3C.

First, the wafer W is transferred into the oxidation device of the resist pattern forming system 2. A $SiO_2$ layer 5 is formed on a surface of the wafer W through an oxidation process in the oxidation device. After that, the wafer W with the $SiO_2$ layer 5 on the surface is transferred to the resist coater. A resist is coated on the $SiO_2$ layer 5 by the resist coater. The wafer W coated with the resist is transferred to the exposure device. An exposure treatment is carried out on a resist layer 6 coated on the wafer W. Subsequently, the wafer W where the exposure treatment has been performed is transferred to the developing apparatus. The resist layer 6 coated on the wafer W is developed by the developing apparatus to form a resist pattern for the line-and-spaces shown in FIG. 3A (step S1). Next, the wafer W with the resist pattern on the surface is unloaded from the developing apparatus and loaded to the roughness evaluation system 4.

The roughness evaluation system 4 evaluates roughness of the resist on the wafer W by using the scatterometry method (step S2). The structure and processing operation of the roughness evaluation system 4 will be described later. If the roughness evaluation system 4 evaluates that there is roughness, the evaluated result is fed back to the resist pattern forming process (step S1) or fed forwarded to an etching process (step S3), thereby changing processing conditions of the resist pattern forming process or etching process.

Roughness is caused by reflection of the exposure light from the surface of the resist or by the mask topography effect. Roughness can be reduced by changing the processing conditions of the resist pattern forming process, for example, by using a hard mask or by remaking the mask by the optical simulation so that roughness cannot occur.

Furthermore, if there is roughness, it is also preferable to modify processing conditions of the etching process such as a flow rate of the etching gas, gas species and pressure in a chamber.

The wafer W after the evaluation of roughness is loaded to the etching system 3. The surface of the wafer W is selectively etched through the resist pattern serving as a mask by the plasma gas in the vacuum processing apparatus of the etching system 3. Therefore, line-and-spaces 7 are formed in the $SiO_2$ layer 5 of the wafer W, as shown in FIG. 3B. Further, a polymer 8 is deposited on the surfaces of the resist layer 6 and the line-and-spaces 7. If the etching process is completed, the wafer W is transferred to the liquid processing apparatus. Polymer removal liquid and resist layer removal liquid are uniformly distributed on the surface of the wafer W by the liquid processing apparatus, so that the polymer 8 and resist layer 6 on the surface of the wafer W are removed, as shown in FIG. 3C (step S3).

Figure 4:
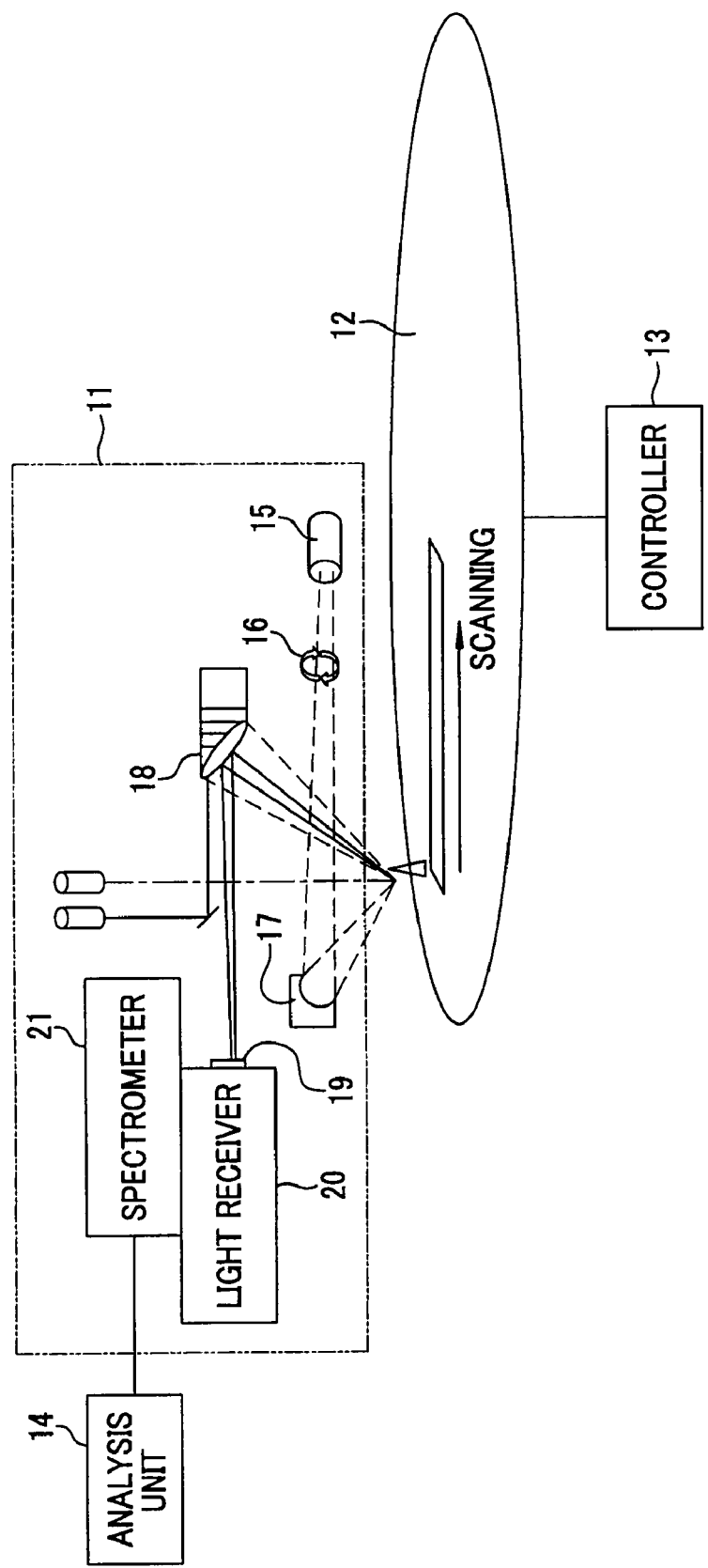
FIG. 4 shows a configuration view of a roughness evaluation system in accordance with an embodiment of the present invention.

FIG. 4 shows a configuration view of the roughness evaluation system 4. The roughness evaluation system 4 includes an optical device 11, a stage 12 serving as a moving device for moving the wafer W in at least one of the x and y directions on the horizontal plane, a controller 13 for controlling the stage 12 and an analysis unit 14 for evaluating roughness based on the variation in the measured value of the optical device 11.

The optical device 11 is provided with a light source 15, a rotating polarizer 16, a focusing elliptical mirror 17, a condensing mirror 18, an analyzer 19, a light receiver 20, and a spectrometer 21. By an ellipsometry method, polarized light is irradiated on the wafer W and a polarization state of the reflected light is measured.

The light source 15 such as a xenon lamp or a halogen lamp emits light of a specified wavelength band. By the rotating polarizer 16, the light emitted from the light source 15 is linearly polarized and then rotated. The linearly polarized light is reflected by the focusing elliptical mirror 17 and irradiated on the wafer W. The spot diameter of the light irradiated on the wafer W ranges from tens of μm to 100 μm. It is preferable for the spot area to have 50 lines or more. The measurement accuracy of roughness can be enhanced by measuring a larger area of the pattern.

The elliptically polarized light reflected by the wafer W is reflected from the condensing mirror 18 to the analyzer 19. In the elliptically polarized light reflected by the condensing mirror 18, only specific polarization components with a specific polarization angle can pass through the analyzer 19. The receiving unit 20 formed of, e.g., a CCD (Charge Coupled Device) camera receives the polarized light having passed through the analyzer 19, converts it into electrical signals and transmits the converted electrical signals to the spectrometer 21. The spectrometer 21 receives electrical signals with numerous different frequencies and displays a spectrum by detecting each frequency component. The spectrometer 21 sends the spectrum data to the analysis unit 14.

The stage 12 includes a table for mounting thereon the wafer W and a moving unit for moving the table in at least one of the x and y directions on the horizontal plane.

Figure 5:
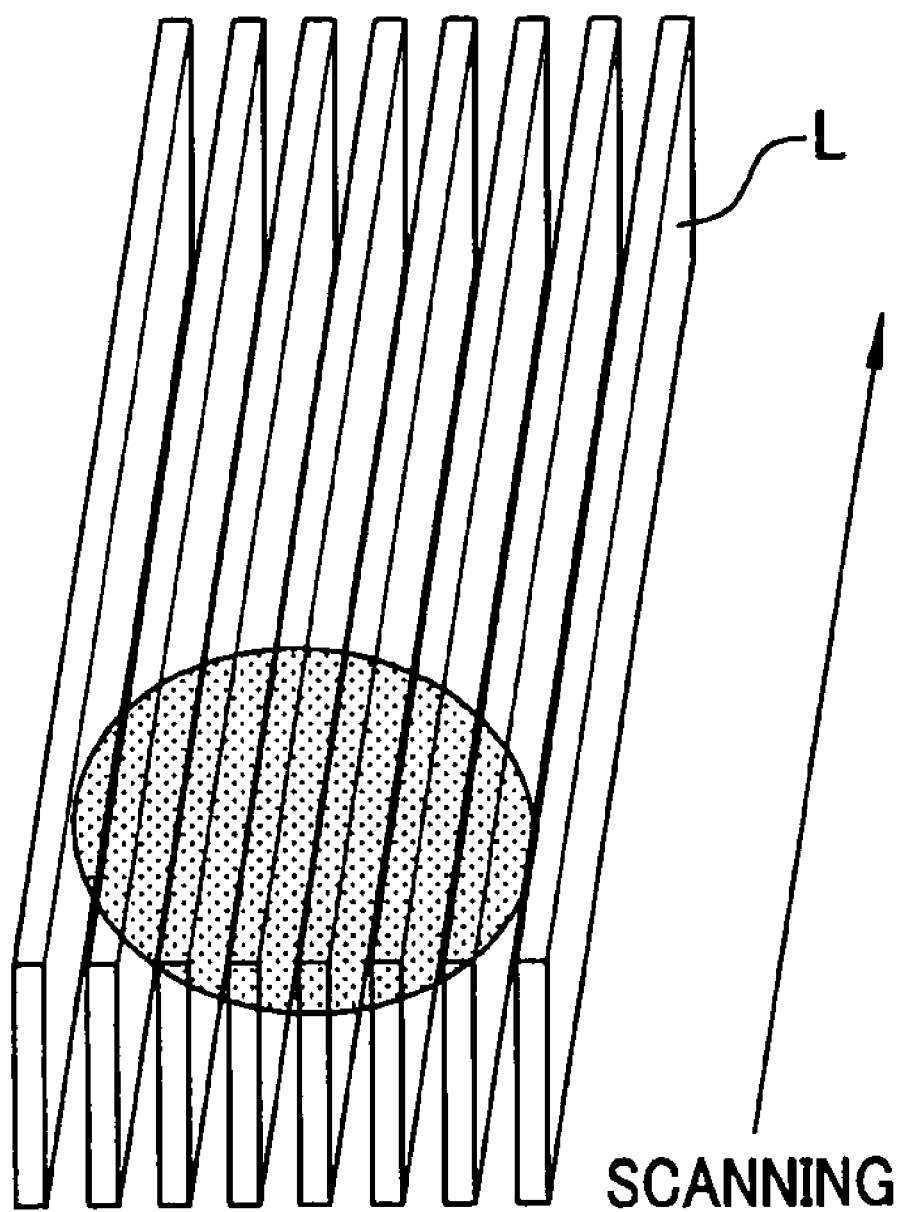
FIG. 5 represents an enlarged perspective view of lines and a light spot on the lines.

The controller 13 controls the movement of the table such that the optical device 11 can measure a state of the light at different locations on the substrate. To be specific, as shown in FIG. 5, the controller 13 controls the table to move in the linear direction of the lines L, i.e., in the length direction of the lines L, so that the optical device 11 can scan in the linear direction of the lines L to measure the polarization state of the light reflected by the wafer W. The object of moving the table in the linear direction of the lines L is to measure the location having the same pattern shape several times for every spot. If such locations having the same pattern shape are not arranged in the linear direction of the lines L, the locations having the same pattern shape may be measured for every spot by moving the table in the x or y direction.

Accuracy of the stage 12 is required to measure roughness of several nm. However, it is difficult to move the table in the linear direction of the lines L with high accuracy of a nanometer level. Therefore, it is preferable to perform a pattern recognition of the location at which the polarization state of the light and correct the position of the wafer such that the image matches the recognized pattern.

Figure 6:
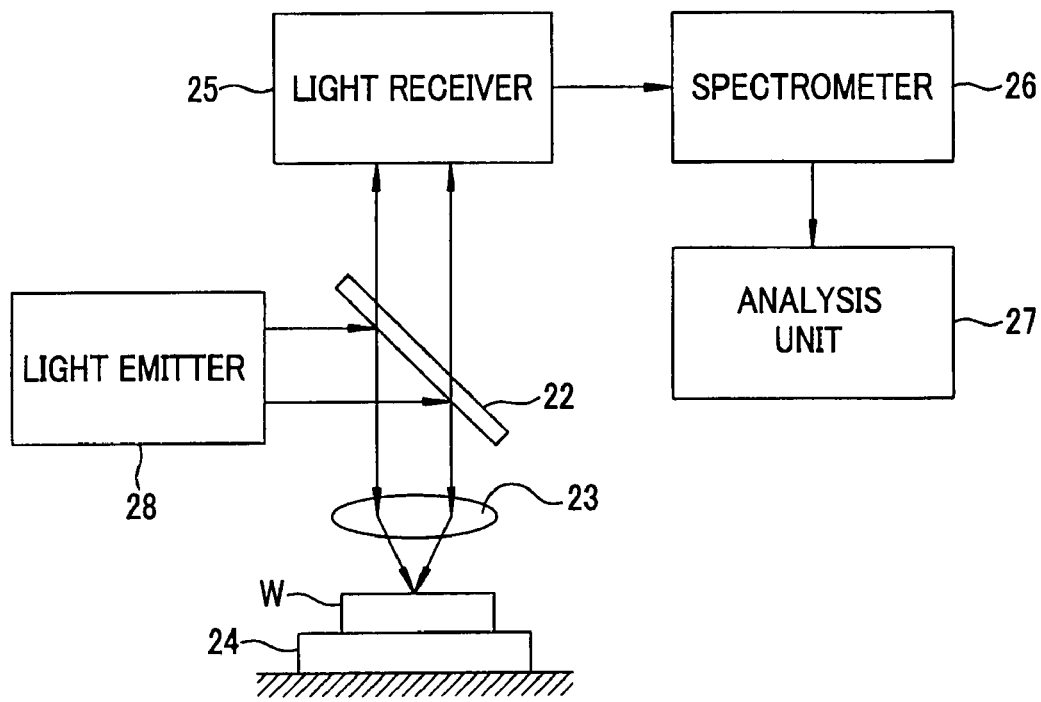
FIG. 6 illustrates a reflectance spectrometer, i.e., another example of an optical device of the roughness evaluation system of the embodiment.

FIG. 6 illustrates a reflectance spectrometer as another example of the optical device. The reflectance spectrometer measures a ratio of intensity of light irradiated on the wafer W to that of the light reflected therefrom, i.e., a reflectivity by using a reflectometry method. A light emitter 28 emits white light in the horizontal direction, which is irradiated onto the wafer W. A reflection mirror 22 reflects the white light which is emitted from the light emitter 28 in the direction parallel to the ground, so that the white light is irradiated onto the wafer W located directly below the reflection mirror 22. A lens 23 focuses the white light incident from the reflection mirror 22 to the surface of the wafer W mounted on the table 24. A light receiver 25 receives the reflected light from the wafer W, converts it into electrical signals and transmits the converted electrical signals to a spectrometer 26. The spectrometer 26 receives electrical signals with numerous different frequencies and displays a spectrum by detecting each frequency component. The spectrometer 26 sends the spectrum data to an analysis unit 27.

On the other hand, the wavelength range or light source of the ellipsometer or reflectance spectrometer is not particularly restricted. As long as a spectrum can be obtained, the present invention is not limited to the ellipsometer or reflectance spectrometer, and similar interferometers may also be used.

Figure 7:
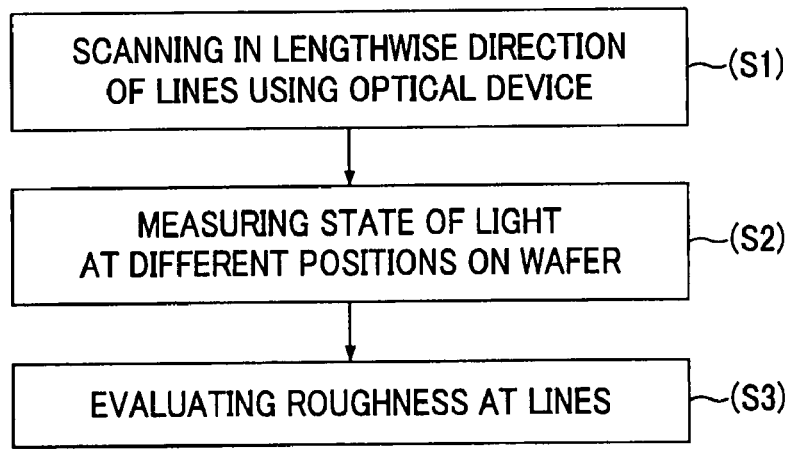
FIG. 7 is a flow chart for showing an operation of the roughness evaluation system of the embodiment.

FIG. 7 is a flow chart for showing an operation of the roughness evaluation system. First, the controller 13 controls the stage 12 so that the optical device 11 can scan in the linear direction of the lines (step S1). After that, the optical device 11 irradiates light on a plurality of locations on the wafer W and measures a state of the reflected light by using the scatterometry method (step S2). The analysis unit 14 evaluates roughness of the lines based on the variation in the spectrum data of the measured value (step S3).

In according to this roughness evaluation method, light is irradiated on plural locations of a reference sample and a state of the light reflected therefrom is measured in advance by using the scatterometry method. Further, variation in the spectrum of the reference sample (reference noise) is extracted. An index corresponding to the difference between the variation in the spectrum of the measurement sample (noise) and the variation in the spectrum of the reference sample (reference noise) is calculated, and if the index is larger than a specific value, it is determined that there exists roughness.

For example, the variation in the spectrum is calculated by the following calculating method. First, a mean of the reflectivities for the wavelength regions which are measured several times is calculated. After that, the difference between the reflectivity for each wavelength region and the mean of the reflectivities, i.e., the mean of the reflectivities for the wavelength regions subtracted from the reflectivity for each wavelength region is calculated. The variation in the spectrum of each wavelength region is obtained by the sum of the square of the difference. Specific examples will be described in detail later.

Figure 8A:
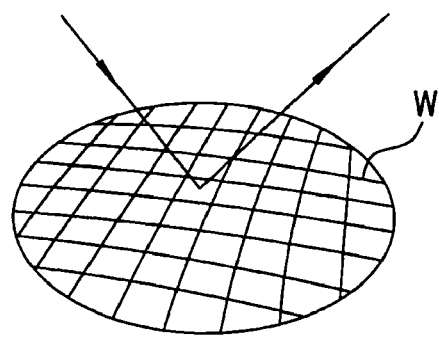
FIGS. 8A and 8B are conceptual diagrams showing a method for extracting reference noise from a reference sample.
Figure 8B:
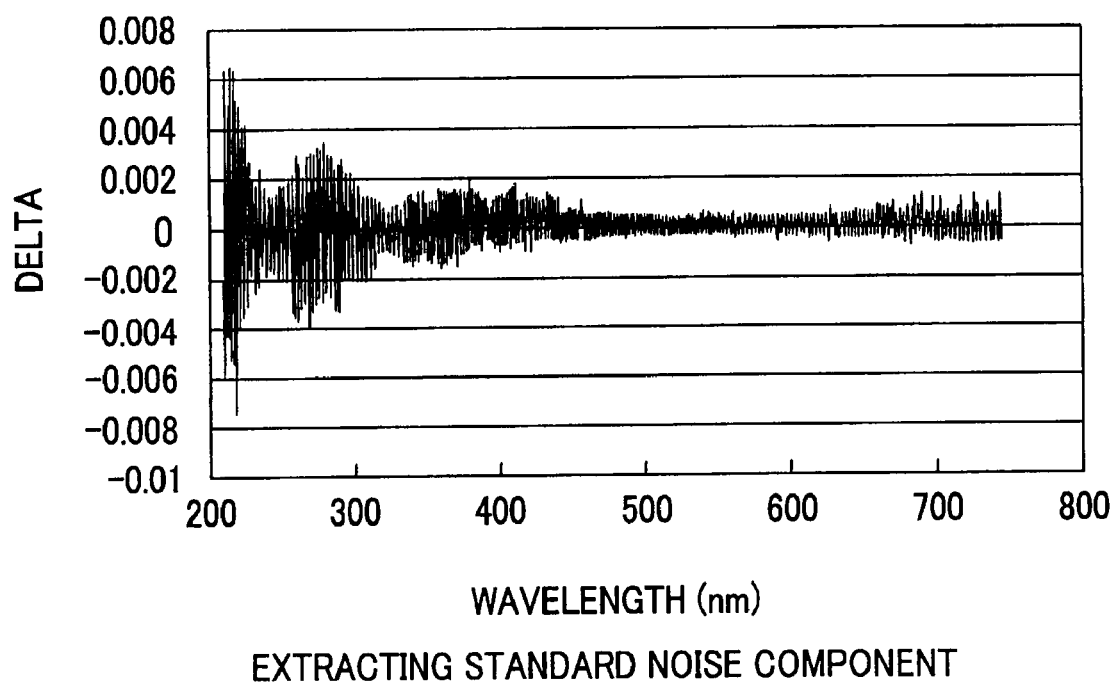

FIGS. 8A and 8B are conceptual diagrams showing a method for extracting the reference noise from the reference sample. An ideal wafer W with small roughness is prepared as the reference sample. The wafer W does not necessarily have the same pattern as a wafer W to be measured, but it is preferable that the transmittance or the refractive index is substantially the same. Further, a wafer deposited with a resist film without patterning may be used instead of the ideal wafer W. The reference sample is scanned in the linear direction of lines and the variation in the spectrum is recorded. In this manner, the reference noise of the reference sample is extracted. In case of the wafer deposited with a resist film without patterning, the reference noise of the optical device itself is obtained.

In the same manner, the measurement sample is scanned in the linear direction of lines and the variation in the spectrum is recorded. If abnormal irregularities occur in the lines of the measurement sample, i.e., if LER and LWR occur, the noise of the spectrum increases. An index corresponding to the difference between the noise of the spectrum of the measurement sample and the reference noise of the spectrum of the reference sample, i.e., the reference noise of the spectrum of the reference sample subtracted from the noise of the spectrum of the measurement sample is calculated, and if the index is larger than a specific value, it is determined that there is roughness. An excess amount of the noise of the spectrum of the measurement sample over the noise of the spectrum of the optical device itself, i.e., the noise of the spectrum of the optical device itself subtracted from the noise of the spectrum of the measurement sample can be recorded as the index of LER or LWR. By storing the noise data, the difference present in the lines can be checked.

If roughness of a line is small, the noise of the spectrum in the linear direction of the line is small. In contrast, if there is LER or LWR in the linear direction of a line, the noise of the spectrum in the linear direction of the line is larger. Thus, the difference between the noise of the spectrum of the measurement sample and the noise of the spectrum of the reference sample becomes large. It is confirmed by the scatterometry method that the ellipsometer or the reflectance spectrometer has sufficient sensitivity to the line shape. Roughness can be evaluated by measuring the noise of the spectrum in the linear direction of the lines using the scatterometry method.

In accordance with the present roughness evaluation method, the noise of the spectrum is directly detected as the roughness component, which differs from the scatterometry method for measuring a pattern shape. Therefore, complicated setting of the profile model or creation of libraries is not needed.

Following effects can be achieved by measurement using the scatterometry method. Since roughness of the lines can be measured without damaging the wafer W or cutting the device, this method can be used for measurement of practical devices. Further, while only a small range (up to several μm) can be measured by the SEM, a relatively large range (up to 100 μm) can be scanned and measured, thereby significantly reducing the measuring time.

Since the present CD-SEM needs to use a large device for vacuum evacuation, it cannot be used only in stand-alone applications. However, the ellipsometer or the reflectance spectrometer can be connected to a CIM (Computer Integrated Manufacturing) system and a data management system to control the processes based on the information. Accordingly, off-line operation can be switched to in-line operation.

The present invention is not limited to the aforementioned embodiment, but can be modified and applied in various ways without departing from the scope of the invention.

Although roughness of the lines of the resist pattern has been measured in the above-mentioned embodiments, it is also preferable to measure roughness of the circuit pattern of the wafer W after the etching process. Since the resist pattern is transferred to the circuit pattern, if there occurs roughness in the lines of the resist pattern, there also occurs roughness in the lines of the circuit pattern after the etching process.

Roughness of the resist with line-and-space patterns has been measured in the above embodiments. However, the present is not limited thereto and may be used to measure roughness of lines of a wafer W with a contact hole or a STI (Shallow Trench Isolation) or a wafer W with an etched gate.

Further, while the difference between the noise of the spectrum of the measurement sample and the noise of the spectrum of the reference sample has been calculated in the above embodiments, the noise of the spectrum of the measurement sample can be used as the index of LER or LWR without calculating the difference. In this case, if the noise of the spectrum of the measurement sample is larger than a specific value, it can be determined that there is roughness.

Moreover, although roughness of the lines on the wafer W serving as a substrate has been measured in the above embodiments, it is also preferable to measure roughness of substrates other than the wafer W, such as a FPD (Flat Panel Display), a mask reticle for a photomask or the like.

Measurement Example

The noise of the reflectance spectrometer serving as a measurement device was first obtained. The noise of the spectrum corresponding to each wavelength was measured 30 times at the same location on the wafer. A wafer where line-and-spaces were formed by resist was used as a sample. FIG. 9 shows a relationship between the wavelength and the reflectivity. A mean of reflectivities corresponding to respective wavelengths was calculated and the difference between each measured reflectivity and the mean reflectivity was obtained. Then, mean square of the difference was obtained as noise data. FIG. 10 shows a relationship between the wavelength and the noise data (the mean square of the difference).

Next, (1) sample 1: roughness small 1 (reference), i.e., a sample where line-and-spaces were formed with a resist with small line roughness LER and LWR was prepared as a reference sample with an ideal line pattern. Further, (2) sample 2: roughness small 2, (3) sample 3: roughness large 1 and (4) sample 4: roughness large 2 were prepared as the measurement samples. Reflectivities for wavelengths of the samples 1 to 4 were measured to thereby calculate the noise. The noise of the spectrum of each sample was calculated in the same manner as that of the measurement device.

(1) roughness small 1 (reference): the noise of the spectrum of reflectivities for wavelengths in case of measuring an ideal line (2) roughness small 2: the noise of the spectrum of reflectivities for wavelengths in case of measuring a location with small roughness which is nearly similar to the ideal line (3) roughness large 1: the noise of the spectrum of reflectivities for wavelengths in case of measuring a line with large roughness (4) roughness large 2: the noise of the spectrum of reflectivities for wavelengths in case of measuring a line with the same large roughness (5) spectrum of the measurement device: the noise of the spectrum of reflectivities for wavelengths in case of measuring the same location 30 times by the measurement device Further, an absolute value of the difference between each noise of samples 2 to 4 and the reference noise of sample 1 was calculated for each wavelength. FIG. 11 shows the calculation results, i.e., the reference noise of sample 1 subtracted from the noise of sample 2, the reference noise of sample 1 subtracted from the noise of sample 3, the reference noise of sample 1 subtracted from the noise of sample 4 and the noise of the measurement device of sample 5. FIG. 11 represents roughness for each wavelength. As shown in FIG. 11, small roughness and large roughness are clearly distinct. Further, the noise of the measurement device is fairly small compared with the above difference. That is, the roughness small and the roughness large are separated with sufficient sensitivity.

Figure 12:
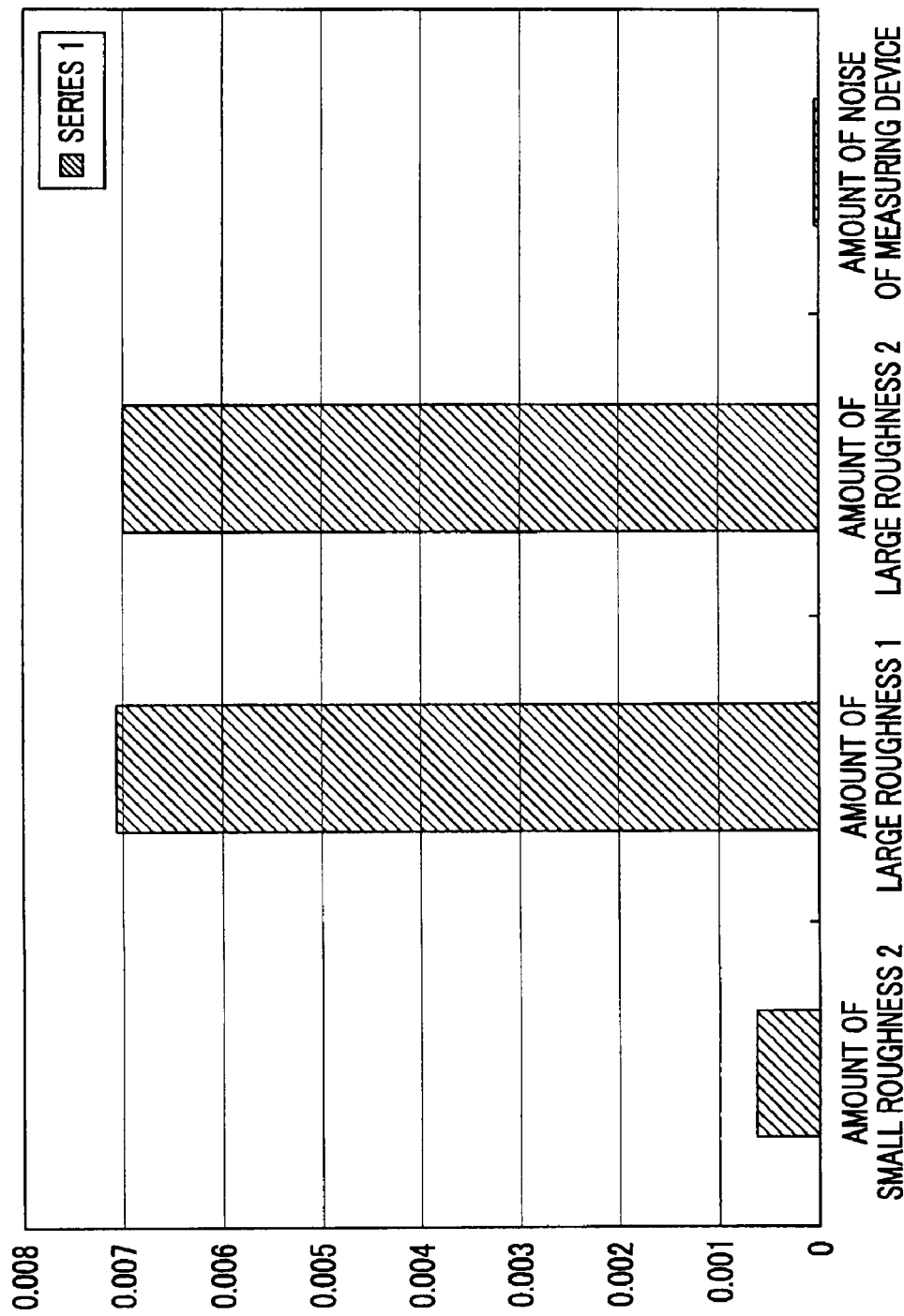
FIG. 12 is a graph showing the result of comparing the sum of the square of the noise of the spectrum.
Figure 13:
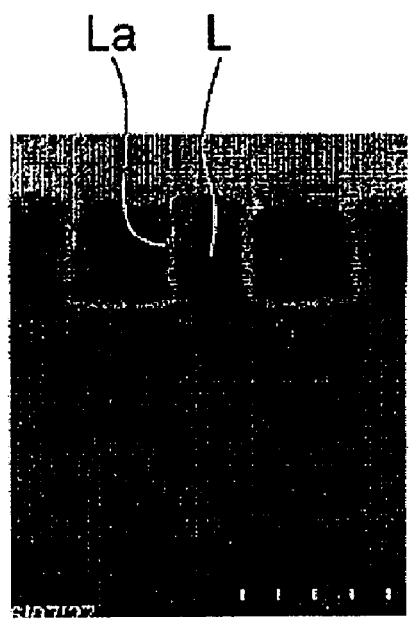
FIG. 13 is a photograph showing LER.
Figure 14:
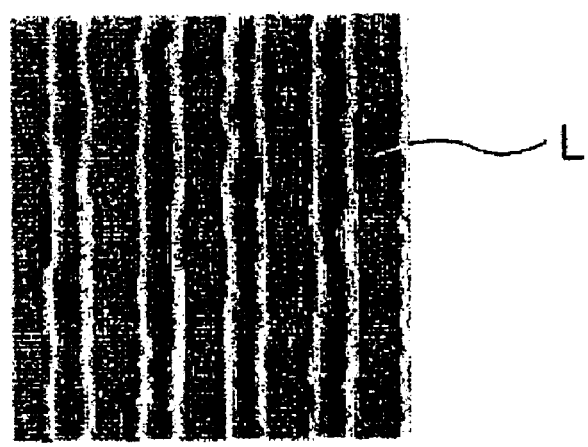
FIG. 14 is a photograph showing LWR.

FIG. 12 shows the result of comparing the sum of the square of the noise of the spectrum. Roughness can be evaluated by setting a specific threshold value between the roughness small and the roughness large.

While the invention has been shown and described with respect to the embodiments, it will be understood by those skilled in the art that various changes and modifications may be made without departing from the scope of the invention as defined in the following claims.

What is claimed is:

1. A roughness evaluation method for evaluating a roughness of one or more lines formed on a substrate, the method comprising:
   a measuring step of irradiating light onto a plurality of locations of the substrate and measuring a state of reflected light by a scatterometry method;
   an analyzing step of evaluating the roughness of the lines based on a variation in values measured in the measuring step; and
   a sample measuring step of irradiating light onto a plurality of locations of a reference sample to measure a state of reflected light in advance by the scatterometry method, wherein,
   in the analyzing step, the variation in the values measured in the measuring step is compared to a variation in values of the reference sample measured in the sample measuring step to calculate an index based on a difference between the variation in the values measured in the measuring step and the variation in the values of the reference sample measured in the sample measuring step, and wherein,
   if the index is larger than a specific value, then a roughness is evaluated to exist.

2. The roughness evaluation method of claim 1, wherein, in the measuring step, the state of the light reflected by the substrate is measured by scanning the lines in a linear direction.

3. The roughness evaluation method of claim 1, wherein, in the measuring step, polarized light is irradiated onto the substrate and a polarization state of reflected light is measured by an ellipsometry method, or light is irradiated onto the substrate and a reflectivity, which is a ratio of an intensity of the light irradiated on the substrate to an intensity of the light reflected therefrom, is measured by a reflectometry method.

4. The roughness evaluation method of claim 1, wherein the lines are formed by a resist using a lithography method.

5. The roughness evaluation method of claim 1, wherein the roughness is a LER which is a size of irregularities on sidewalls of the line.

6. The roughness evaluation method of claim 1, wherein the lines have line-and-space patterns in which a plurality of line patterns are arranged at a specified interval.

7. A lithography method comprising:
   a resist pattern forming step of coating a resist film on a substrate, exposing it through a mask and developing it;
   an etching step of removing a part of the substrate that is not covered with the resist film by etching;
   a roughness evaluating step of evaluating a roughness of the resist after the resist pattern forming step or evaluating roughness of a circuit pattern after the etching step; and
   a processing condition changing step of changing processing conditions of the resist pattern forming step or the etching step based on the roughness evaluated in the roughness evaluating step, wherein
   the roughness evaluating step includes:
   a measuring step of irradiating light onto a plurality of locations of the substrate and measuring a state of reflected light by a scatterometry method;
   an analyzing step of evaluating a roughness of one or more lines based on a variation in values measured in the measuring step; and
   a sample measuring step of irradiating light onto a plurality of locations of a reference sample to measure a state of reflected light by the scatterometry method, wherein,
   in the analyzing step, the variation in the values measured in the measuring step is compared to a variation in values of the reference sample measured in the sample measuring step to calculate an index based on a difference between the variation in the values measured in the measuring step and the variation in the values of the reference sample measured in the sample measuring step, and wherein,
   if the index is larger than a specific value, then a roughness is evaluated to exist.

8. A roughness evaluation system for evaluating a roughness of one or more lines formed on a substrate, the system comprising:
   an optical device which irradiates light onto a reference sample and the substrate, and measures states of reflected light from the reference sample and the substrate by a scatterometry method;

a moving device which moves the substrate in at least one of an x-direction and a y-direction on a horizontal plane;

a controller which controls the moving device such that the optical device measures a plurality of locations on the substrate; and an analysis unit which evaluates the roughness based on a variation in values measured at the plurality of locations on the substrate, wherein the analysis unit compares the variation in the values measured at the plurality of the locations on the substrate to a variation in values measured from the reference sample to calculate an index based on a difference between the variation in the values measured at the plurality of the locations on the substrate and the values of the reference sample, and wherein, if the index is larger than a specific value, the analysis unit evaluates that there is a roughness.

9. The roughness evaluation system of claim 8, wherein the controller controls the moving device such that the optical device scans in the linear direction of the lines to measure the state of the light reflected by the substrate.

10. The roughness evaluation system of claim 8, wherein the optical device is an ellipsometer or a reflectance spectrometer.

11. A lithography system comprising:

a resist pattern forming system which coats a resist film on a substrate, exposing it through a mask and developing it;

an etching system which removes a part of the substrate that is not covered with the resist film by etching; and a roughness evaluation system which evaluates a roughness of a resist on the substrate or a circuit pattern on the substrate, wherein processing conditions of the resist pattern forming system or the etching system are changed based on the roughness evaluated by the roughness evaluation system, and wherein the roughness evaluation system includes:

an optical device which irradiates light onto a reference sample and the substrate, and measures states of reflected light from the reference sample and the substrate by a scatterometry method;

a moving device which moves the substrate in at least one of an x-direction and a y-direction on a horizontal plane;

a controller which controls the moving device such that the optical device measures a plurality of locations on the substrate; and an analysis unit which evaluates the roughness based on a variation in values measured at the plurality of locations on the substrate, wherein the analysis unit compares the variation in the values measured at the plurality of the locations on the substrate to a variation in values measured from the reference sample to calculate an index based on a difference between the variation in the values measured at the plurality of the locations on the substrate and the values of the reference sample, and wherein, if the index is larger than a specific value, the analysis unit evaluates that there is a roughness.

* * * * *